(12) United States Patent
Luniewski et al.

(10) Patent No.: US 12,489,040 B2
(45) Date of Patent: Dec. 2, 2025

(54) SEMICONDUCTOR PACKAGE WITH BALANCED IMPEDANCE

(71) Applicant: Infineon Technologies Austria AG, Villach (AT)

(72) Inventors: Peter Luniewski, Poing (DE); Markus Neubert, Munich (DE); Michael Fuegl, Neumarkt (DE); Waldemar Jakobi, Soest (DE); Michael Leipenat, Pommelsbrunn (DE); Egbert Lamminger, Soest (DE)

(73) Assignee: Infineon Technologies Austria AG, Villach (AT)

( * ) Notice: Subject to any disclaimer, the term of this patent is extended or adjusted under 35 U.S.C. 154(b) by 551 days.

(21) Appl. No.: 17/903,512

(22) Filed: Sep. 6, 2022

(65) Prior Publication Data
US 2024/0079297 A1    Mar. 7, 2024

(51) Int. Cl.
*H01L 23/495*    (2006.01)
*H01L 23/00*    (2006.01)
*H01L 23/31*    (2006.01)
*H01L 23/498*    (2006.01)
*H01L 25/07*    (2006.01)

(52) U.S. Cl.
CPC .... *H01L 23/49575* (2013.01); *H01L 23/3107* (2013.01); *H01L 23/49503* (2013.01); *H01L 23/49562* (2013.01); *H01L 24/48* (2013.01); *H01L 2224/48245* (2013.01)

(58) Field of Classification Search
CPC ........... H01L 23/49575; H01L 23/3107; H01L 23/49503; H01L 23/49562; H01L 23/3121; H01L 23/3735; H01L 23/49531; H01L 23/49811; H01L 23/5386; H01L 23/49541; H01L 24/48; H01L 24/49; H01L 25/072; H01L 2224/48245
See application file for complete search history.

(56) References Cited

U.S. PATENT DOCUMENTS

| | | | |
|---|---|---|---|
| 9,305,876 B2 | 4/2016 | Hosseini et al. | |
| 11,342,275 B2 * | 5/2022 | Wei | H01L 21/56 |
| 2002/0027283 A1 | 3/2002 | Hiyoshi | |
| 2014/0218885 A1 | 8/2014 | Hosseini et al. | |
| 2016/0056132 A1 * | 2/2016 | Bayerer | H01L 25/072 257/784 |
| 2019/0295932 A1 | 9/2019 | Nakata et al. | |
| 2019/0355634 A1 | 11/2019 | Liu et al. | |
| 2022/0254762 A1 * | 8/2022 | Watts | H01L 24/48 |

* cited by examiner

*Primary Examiner* — Joshua Benitez Rosario
*Assistant Examiner* — Moataz Khalifa
(74) *Attorney, Agent, or Firm* — Murphy, Bilak & Homiller, PLLC

(57) ABSTRACT

A semiconductor package includes a substrate including a die pad, first and second discrete transistor dies mounted on the die pad, an encapsulant body that encapsulates the first and second discrete transistor dies, and a plurality of leads that are exposed from the encapsulant body, wherein the first and second discrete transistor dies are connected in parallel with one another by electrical interconnections that electrically connect common terminals of the first and second discrete transistor dies to one of the leads, and wherein at least one of the electrical interconnections has a balanced configuration that provides substantially identical electrical impedance as between the common terminals of the first and second discrete transistor dies and the lead to which they are connected.

16 Claims, 12 Drawing Sheets

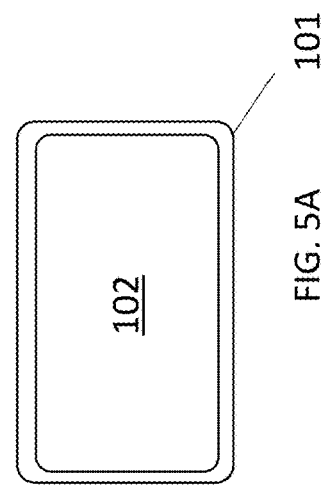
FIG. 5A
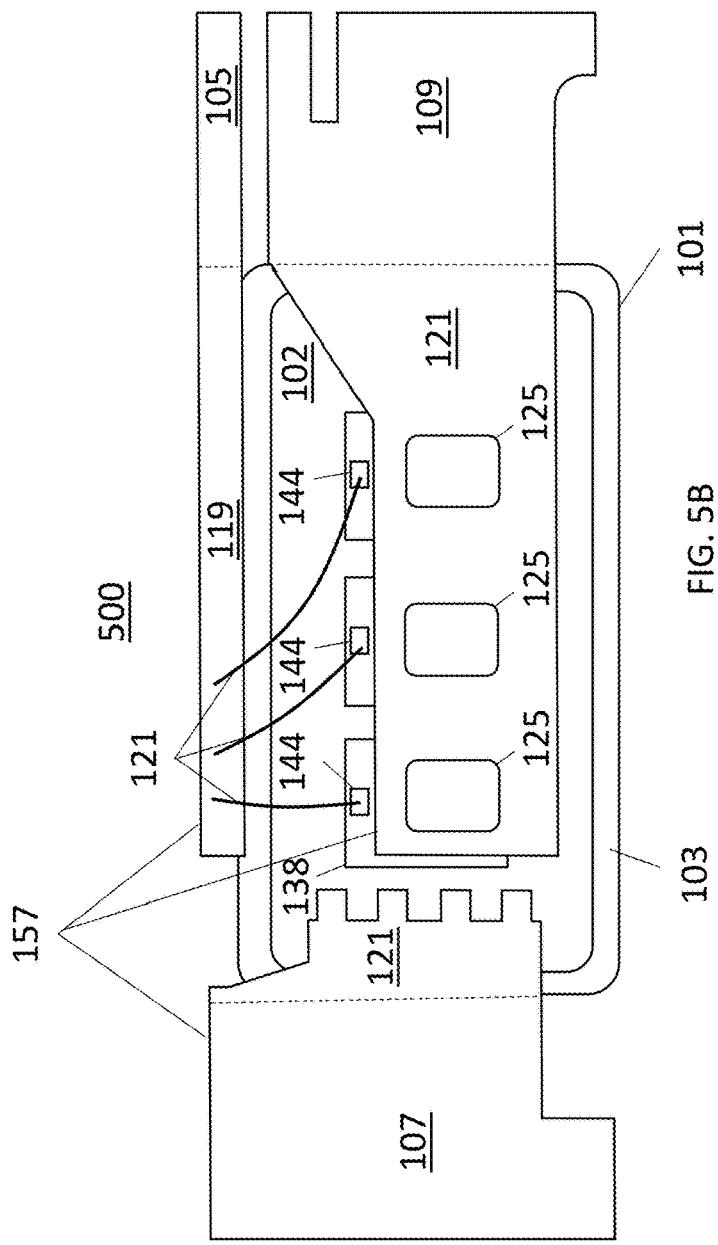
FIG. 5B
FIGURE 5

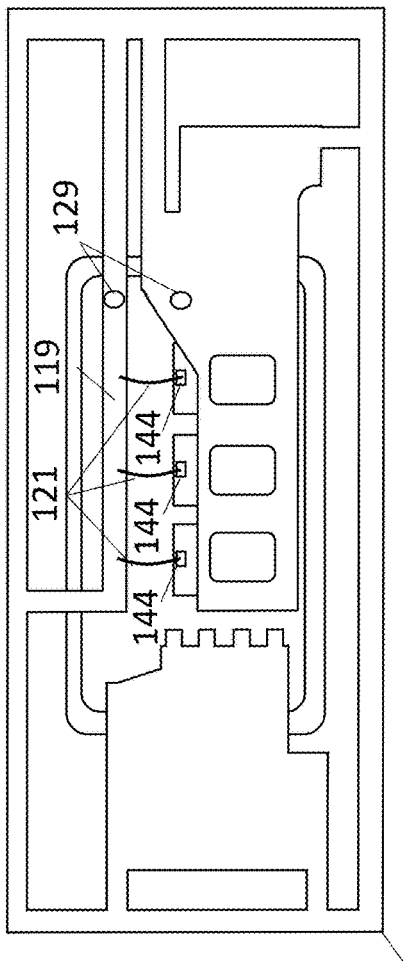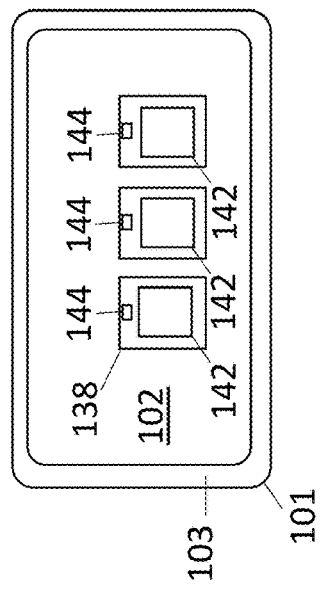
FIG. 6A
FIG. 6B
FIG. 6C
FIGURE 6

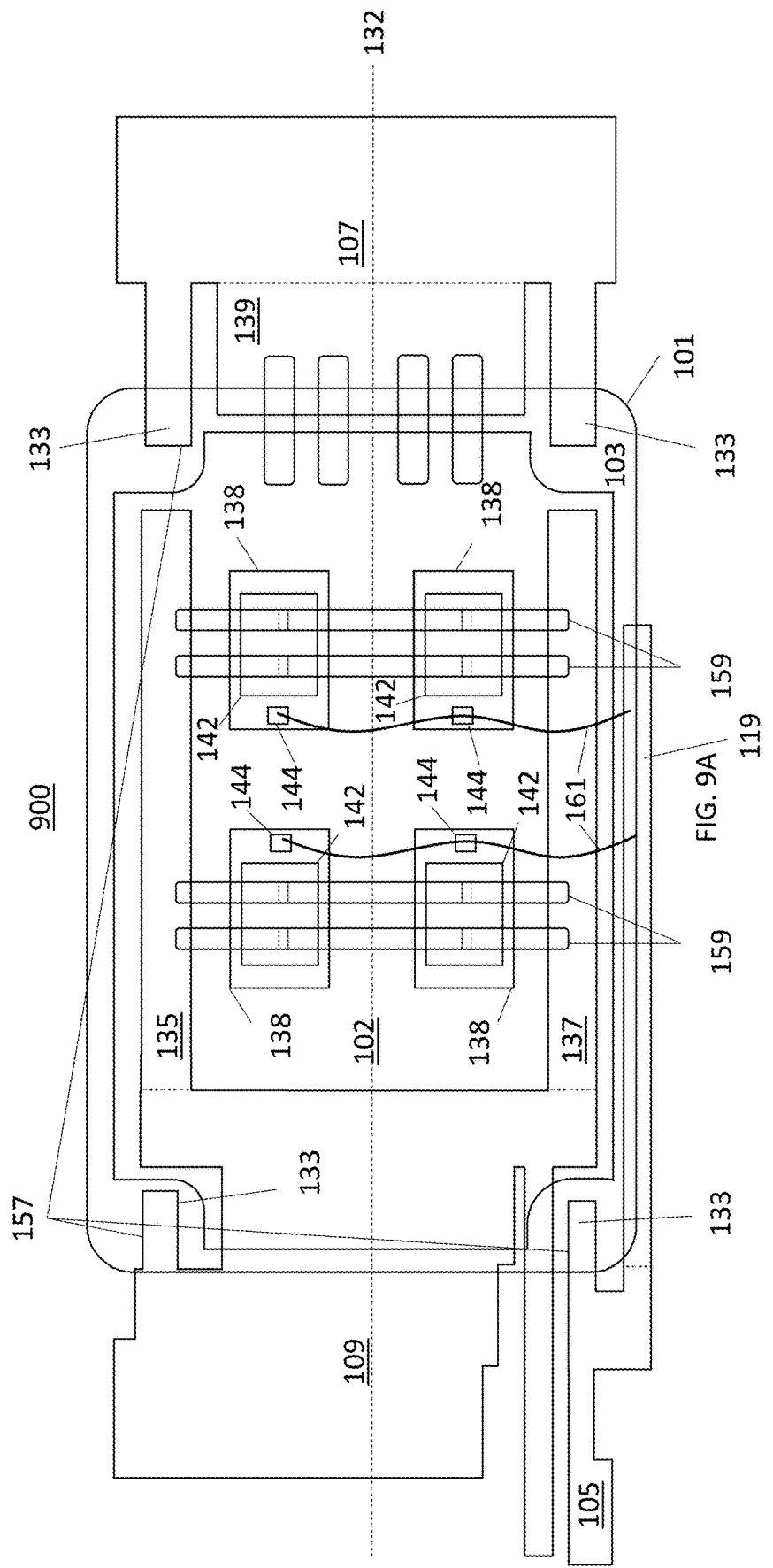

SEMICONDUCTOR PACKAGE WITH BALANCED IMPEDANCE

BACKGROUND

Many applications such as automotive and industrial applications utilize power devices to perform switching of large voltages and/or currents. Power devices generally refer to semiconductor devices capable of blocking voltages of at least 100V (volts), and more typically on the order of 600V or more and/or semiconductor devices capable of conducing currents of least 1 A (amperes), and more typically on the order of 10 A or more. Semiconductor packages or modules with modern power devices that are designed to minimize power losses can provide power efficient solutions to reduce or prevent anthropogenic emissions of greenhouse gases (GHG). For instance, discrete power devices can be used in hybrid electric or purely electric vehicles to switch large amounts of current and/or voltage. More generally, modern power devices can be incorporated into any into any electrical setting to improve efficiency and reduce environmental impact. By improving the performance characteristics of power devices such as maximum rated current, voltage, on-resistance, output capacitance, etc., the efficiency of these devices can be improved, and a beneficial power consumption can be realized.

SUMMARY

Those skilled in the art will recognize additional features and advantages upon reading the following detailed description, and upon viewing the accompanying drawings.

A semiconductor package is disclosed. According to an embodiment, the semiconductor package comprises a substrate comprising a die pad, first and second transistor dies mounted on the die pad, an encapsulant body that encapsulates the first and second transistor dies, and a plurality of leads that are exposed from the encapsulant body, wherein the first and second transistor dies are connected in parallel with one another by electrical interconnections that electrically connect common terminals of the first and second transistor dies to one of the leads, and wherein at least one of the electrical interconnections has a balanced configuration that provides substantially identical electrical impedance as between the common terminals of the first and second transistor dies and the lead to which they are connected.

According to another embodiment, the semiconductor package comprises a substrate comprising a die pad, first and second transistor dies mounted on the die pad, an encapsulant body that encapsulates the first and second transistor dies, and a plurality of leads that are exposed from the encapsulant body, the plurality of leads comprising a gate lead, a first DC voltage lead, and a second DC voltage lead, a gate connection between the gate lead and gate terminals of the first and second transistor dies, a first DC voltage connection between the first DC voltage lead and first load terminals of the first and second transistor dies; and a second DC voltage connection between the second DC voltage lead and second load terminals of the first and second transistor dies, wherein the first and second transistor dies are arranged on opposite sides of a first axis of symmetry, and wherein at least one of the gate connection, the first DC voltage connection, and the second DC voltage connection comprises electrically conductive elements or regions that are symmetrically arranged with respect to the first axis of symmetry.

According to another embodiment, the semiconductor package comprises a substrate comprising a die pad of metal, first and second transistor dies mounted on the die pad, each of the first and second transistor dies comprising first load terminals that face and electrically connect with the die pad and second load terminals and gate terminals that face away from the die pad, a gate lead that is electrically connected to the gate terminals of the first and second transistor dies, a first DC voltage lead that is electrically connected to the first load terminals from the first and second transistor dies via the die pad, and a second DC voltage lead that is electrically connected to the second load terminals from the first and second transistor dies, wherein the gate lead is part of a continuous gate metal structure that extends over the base pad and comprises an internal gate runner, and wherein the gate terminals of the first and second transistor dies are electrically connected to the internal runner by interconnect elements.

According to another embodiment, the semiconductor package comprises a substrate comprising a die pad of metal, first and second discrete transistor dies mounted on the die pad, each of the first and second discrete transistor dies comprising first load terminals that face and electrically connect with the die pad and second load terminals and gate terminals that face away from the die pad, a gate lead that is electrically connected to the gate terminals of the first and second transistor dies, a first DC voltage lead that is electrically connected to the first load terminals from the first and second discrete transistor dies via the die pad, and a second DC voltage lead that is electrically connected to the second load terminals from the first and second discrete transistor dies, wherein the second DC voltage lead is part of a continuous second DC voltage structure that extends over the substrate and comprises first and second elongated rails, and wherein the first and second elongated rails directly overlap with the die pad.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, illustrates a semiconductor packaging assembly, according to an embodiment. FIG. 1A illustrates the semiconductor packaging assembly from a plan-view perspective; and FIG. 1B illustrates the semiconductor packaging assembly from a side-view perspective.

FIGS. 5A, 5B, and 5C illustrates a semiconductor packaging assembly, according to an embodiment. FIG. 5A illustrates the substrate configuration of the semiconductor packaging assembly; FIG. 5B illustrates the semiconductor packaging assembly from a plan-view perspective; and FIG. 5C illustrates the semiconductor packaging assembly from a side-view perspective.

FIG. 6, which includes FIGS. 6A, 6B, and 6C illustrates selected method steps for forming a semiconductor package, according to an embodiment. FIG. 6A illustrates providing a substrate and with transistor dies 138, FIG. 6B illustrates arranging a lead frame over the substrate, and FIG. 6C illustrates forming interconnect elements between the transistor dies 138 and the lead frame.

FIGS. 7A and 7B, illustrates a semiconductor package, according to an embodiment. FIG. 7A illustrates the semiconductor package from a plan-view perspective; and FIG. 7B illustrates the semiconductor package from a side-view perspective FIG. 8, which includes FIG. 8A illustrates the semiconductor packaging assembly from a plan-view perspective before providing the lead frame; and FIG. 8B illustrates the semiconductor packaging assembly from a plan-view perspective after providing the lead frame and forming the electrical interconnect elements.

FIGS. 9A and 9B, illustrates a semiconductor packaging assembly, according to an embodiment. FIG. 9A illustrates the semiconductor packaging assembly from a plan-view perspective; and FIG. 9B illustrates the semiconductor packaging assembly from a side-view perspective.

DETAILED DESCRIPTION

Embodiments of a power device package with an advantageous layout and interconnect arrangement are disclosed herein. The package comprises a substrate that comprises a die pad. A plurality of transistor dies 138 is mounted on a die pad. These transistor dies 138 are connected in parallel with one another by interconnections. In embodiments, at least some of these interconnections have a balanced configuration that provides substantially identical electrical impedance as between the common terminals of the parallel connected transistor dies 138 and the lead to which they are connected. This balanced configuration can be realized through symmetric arrangement of the transistor dies 138 and the conducive elements or regions responsible for the parallel connection. The matching of the electrical impedance improves the simultaneous switching of the transistor dies 138, provides more balanced static current distribution, and facilitates a greater density of transistor dies 138 per area. In embodiments, the semiconductor package comprises a single continuous lead frame structure that provides the package leads and comprises interior connection regions that extend over the substrate. This allows for the use of short and substantially similar or identical impedance interconnect elements and allows for die mounting and interconnect formation to occur in a single step process.

Figure 1:
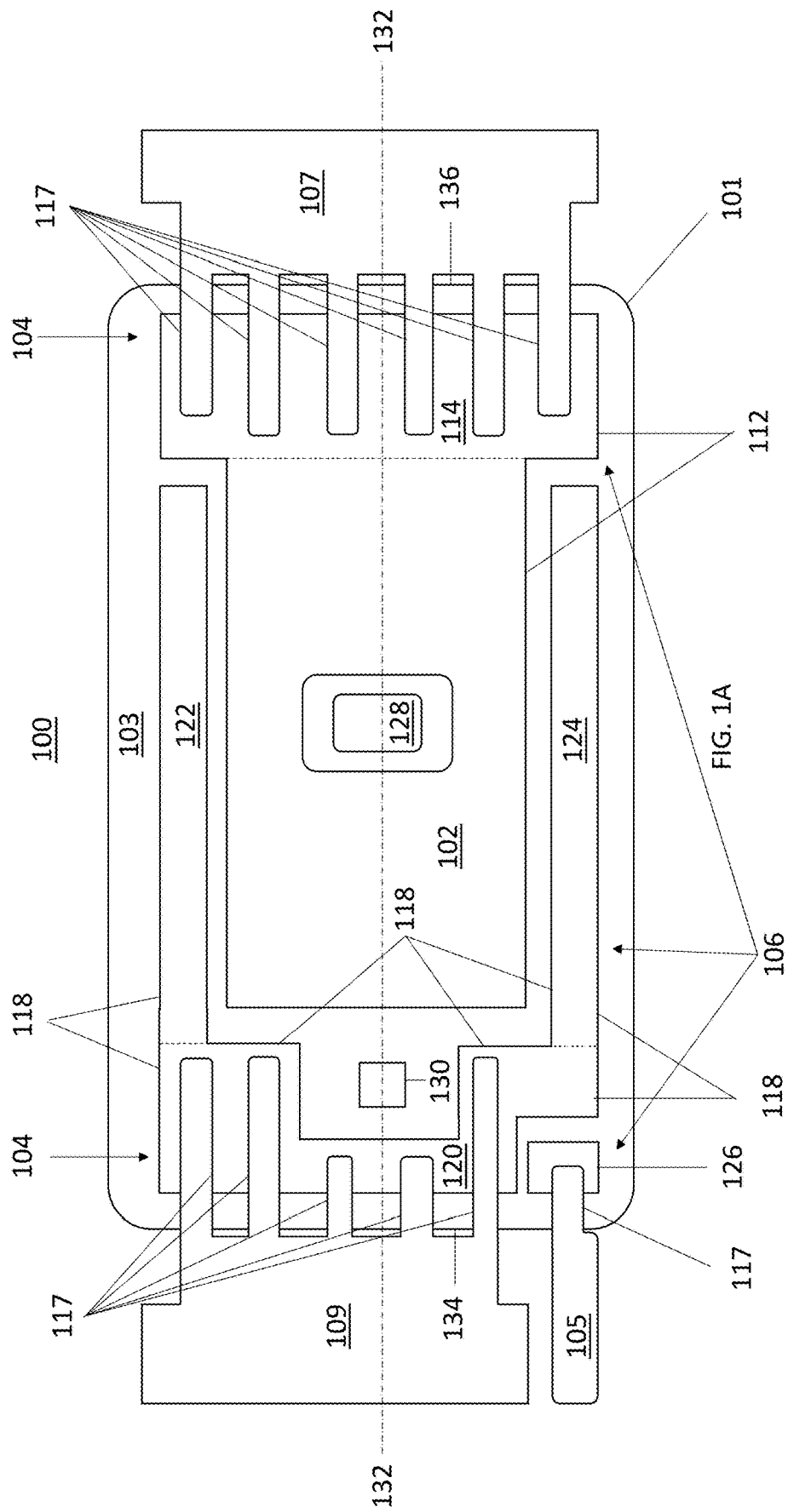
FIG. 1, which includes
Figure 1:
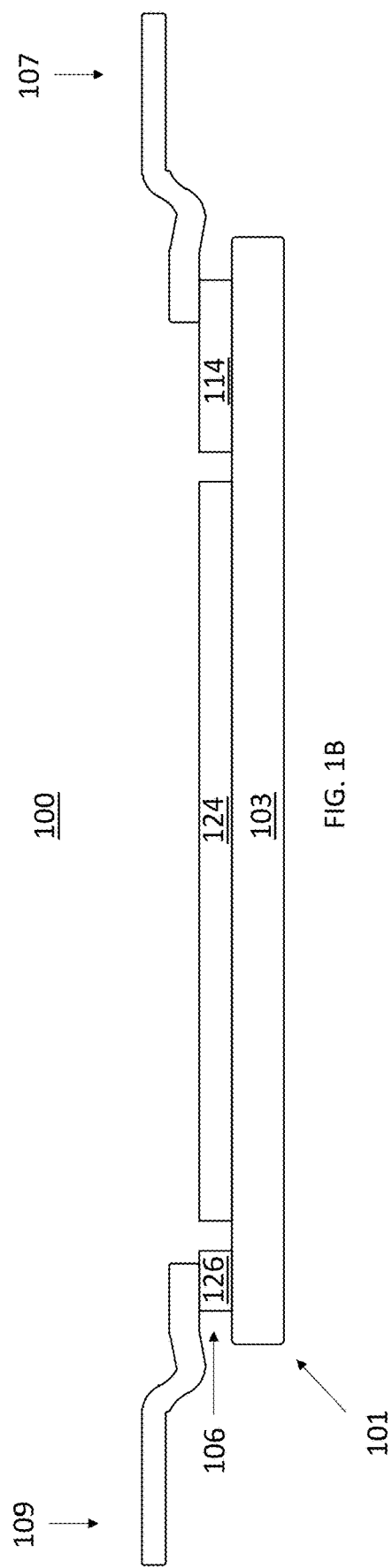

Referring to FIG. 1, a semiconductor packaging assembly 100 is shown, according to an embodiment. The semiconductor packaging assembly 100 comprises a substrate 101 comprising an optional base pad 103 and a die pad 102 disposed on the base pad 103. The base pad 103 is configured as an electrically insulating region. For example, the base pad 103 may include any of a wide variety of electrically insulating materials used in electronics applications. In particular, the base pad 103 may include any one or more of: ceramic material, e.g., Al$_2$O$_3$(Alumina), AlN (Aluminium Nitride), etc., pre-peg material, e.g., FR-2, FR-4, CEM-1, G-10, etc., plastic, epoxy, glass, etc. The die pad 102 is an electrically conductive region. For example, the die pad may comprise or be plated with any or more of Cu, Ni, Ag, Au, Pd, Pt, NiV, NiP, NiNiP, NiP/Pd, Ni/Au, NiP/Pd/Au, or NiP/Pd/AuAg. In an embodiment, the die pad 102 is a layer of Cu or Cu alloy which may include a coating layer such as an Ni based coating layer which forms an outer surface of the structured metallization layer 102. In the case that the base pad 103 is omitted, the die pad may be provided as a simple lead frame without an underlying base pad. The die pad may be exposed from an encapsulant at the other side of chip mounting side, thus forming an exposed die pad package.

In the embodiment of FIG. 1, the substrate 101 comprises a structured metallization layer 106 disposed on the base pad 103, and the die pad 102 is formed in the structured metallization layer 106. The structured metallization layer 106 comprises additional pad regions that are laterally isolated from the die pad 102, as will be discussed in further detail below. This structured metallization layer 106 can be provided from a continuous and uniform thickness region of metal and patterned into the necessary geometry by metal processing techniques such as punching, stamping, etching, etc. The structured metallization layer 106 can be formed on or attached to an upper surface of the base pad 103. The substrate 101 comprising the structured metallization layer 106 disposed on the base pad 103 can correspond to an electronics circuit carrier. For example, the structured metallization layer 106 can correspond to the upper layer of a power electronics substrate, such as a DBC (direct bonded copper) substrate, an AMB (active metal brazed) substrate, or an IMS (insulated metal substrate), with the base pad 103 corresponding to the underlying substrate comprising, e.g., ceramic or organic insulator. In another example, the structured metallization layer 106 can correspond to a metal lead frame, with the substrate 101 corresponding to a region of mold compound or separate insulating plate that is encapsulated within a mold compound.

The semiconductor packaging assembly 100 comprises a plurality of leads. These leads extend out from outer edge sides of the substrate 101 and form externally accessible points of electrical contact to the devices mounted within the semiconductor packaging assembly 100. The plurality of leads comprises a gate lead 105, a first DC voltage lead 107, and a second DC voltage lead 109. The number of gate leads 105, first DC voltage leads 107, or second DC voltage leads 109 may vary from what is shown. Moreover, the semiconductor packaging assembly 100 may comprise separated but functionally equivalent leads.

The structured metallization layer 106 comprises a first DC voltage pad 112 that is arranged to provide a first DC voltage (e.g., a positive supply voltage, +100V, 600V, etc.) to the transistor dies 138 mounted thereon. The first DC voltage pad 112 is a continuous metal pad region that comprises the die pad 102 and a first landing pad 114. The first DC voltage lead 107 is electrically connected to the first DC voltage pad 112 via interior contact fingers 117 that form a direct ohmic connection to the first landing pad 114.

The structured metallization layer 106 comprises a second DC voltage pad 118 that is electrically isolated from the first DC voltage pad 112 and is arranged to provide a second DC voltage (e.g., a reference potential voltage such as ground) to the transistor dies 138 mounted on the die pad 102. The second DC voltage pad 118 is a continuous metal pad region that comprises a second landing pad 120 and first and second elongated rails 122, 124. The second DC voltage lead 109 is electrically connected to the second DC voltage pad 118 via interior contact fingers 117 that form a direct ohmic connection to the second landing pad 120. The first and second elongated rails 122, 124 form a u-shaped structure that extends along opposite sides of the die pad 102. That is, the first rail 122 extends along a first side of the die pad 102 and the second rail 124 extends along a second side of the die pad 102 that is opposite from the first side.

The structured metallization layer 106 comprises a plurality of gate connection pads that are electrically isolated from the first and second DC voltage pads 112, 118 and are arranged to provide a control signal to the transistor dies 138 mounted on the die pad 102. These gate connection pads comprise a gate landing pad 126, a gate distribution pad 128, and a second gate connection pad 130. The gate lead 105 is electrically connected to the gate landing pad 126 via an interior contact finger 117 that forms a direct ohmic connection to gate landing pad 126. The gate distribution pad 128 is pad region of the structured metallization layer 106 that is arranged within the die pad 102 and is laterally isolated from the die pad 102. As shown, the die pad 102 comprises an opening and the gate distribution pad 128 is arranged within this opening such that the gate distribution pad 128 is surrounded by the die pad 102 in every direction.

Certain features of the semiconductor packaging assembly 100 may be shaped and/or arranged with reference to a first axis of symmetry 132 that runs longitudinally across the substrate 101 and intersects first and second outer sides 134, 136 of the substrate 101 that the leads protrude away from. The first axis of symmetry 132 may bisect any one or more of: the first DC voltage pad 112, the second DC voltage pad 118, the gate distribution pad 128, and the second gate connection pad 130.

At least some of the pads of the structured metallization layer 106 may have a symmetric geometry or a substantially symmetric geometry relative to the first axis of symmetry 132, meaning that one half of this pad is disposed on one side of the first axis of symmetry 132 (e.g., the upper side from the perspective of FIG. 1), and a second half of this pad is disposed on the opposite side of the first axis of symmetry 132 (e.g., the lower side from the perspective of FIG. 1) and forms the mirror image or substantially the mirror image of the other half of this pad. For example, in an embodiment, the first DC voltage pad 112 including the first landing pad 114 and the die pad 102 is symmetrical with respect to the first axis of symmetry 132. Separately or in combination, the gate distribution pad 128 and/or the second gate connection pad 130 may be symmetrical with respect to the first axis of symmetry 132. Separately or in combination, the second DC voltage pad 118 may be substantially symmetrical with respect to the first axis of symmetry 132. In particular, the first and second elongated rails 122, 124 may be symmetrical with respect to the first axis of symmetry 132. The second landing pad 120 may be substantially symmetrical with respect to the first axis of symmetry 132, while not being exactly symmetrical due to the space needed to accommodate the gate lead 105 and the gate landing pad 126. A substantially symmetrical arrangement as used herein may encompass arrangements wherein the two parts of the shape on either side of the axis of symmetry have boundaries that are at least 90% coextensive with one another by length, and/or arrangements wherein the two parts of the shape on either side of the first axis of symmetry overlap in at least 90% of the overall area when superimposed on one another.

Figure 2:
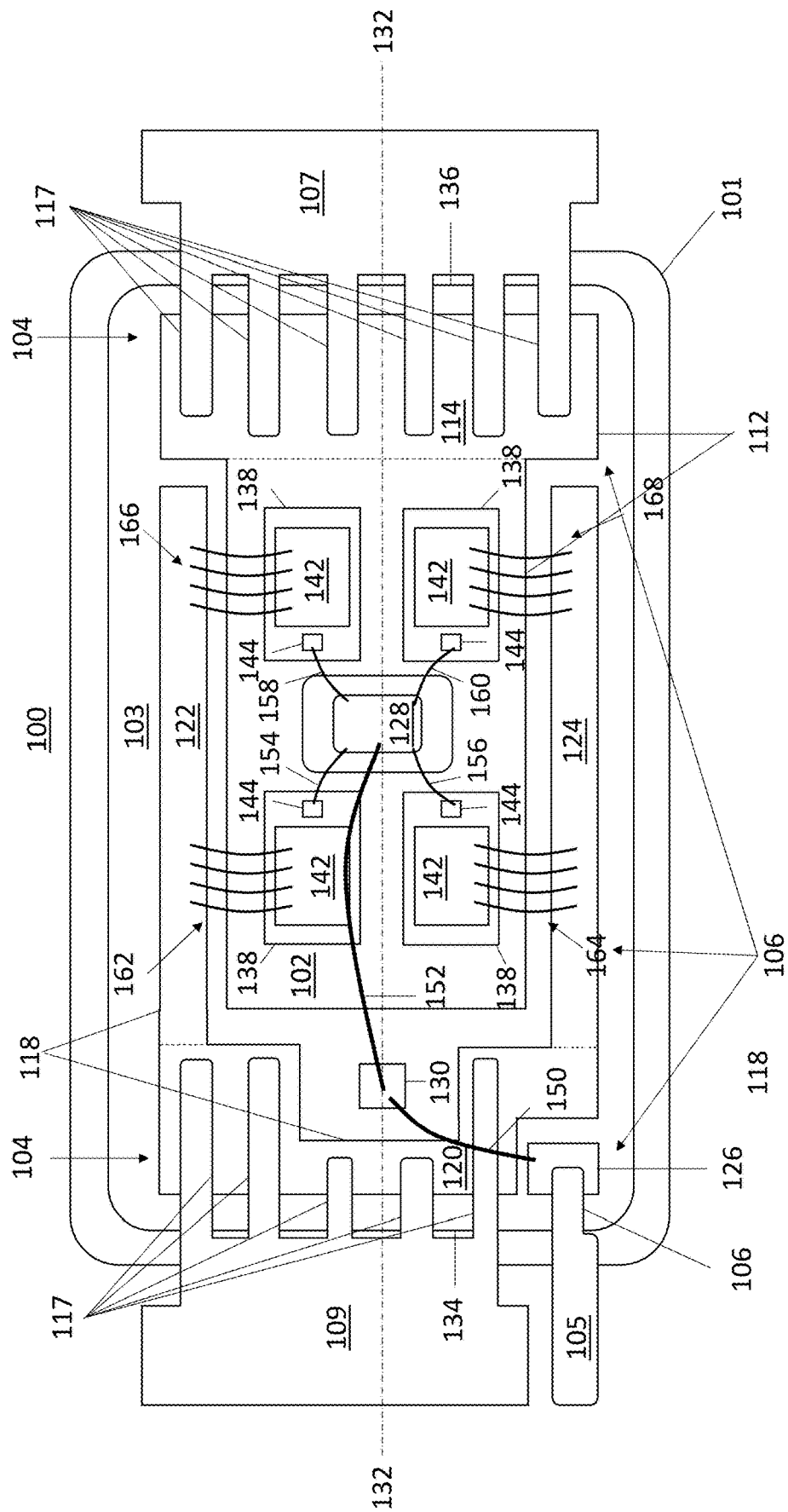
FIG. 2 illustrates the semiconductor packaging assembly of FIG. 1 with semiconductor dies and interconnect elements mounted in the assembly, according to an embodiment.

Referring to FIG. 2, the semiconductor packaging assembly 100 is shown with a plurality of transistor dies 138 mounted on the die pad 102. The transistor dies 138 disclosed herein can be formed in a wide variety of device technologies and/or include a wide variety of semiconductor materials. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc. The transistor dies 138 disclosed herein can be configured as discrete transistor dies such as MOSFETs (Metal Oxide Semiconductor Field Effect Transistors), IGBTs (Insulated Gate Bipolar Transistors), or HEMTs (High Electron Mobility Transistors), for example. The transistor dies 138 disclosed herein can be power devices that are rated to block voltages of at least 100 V (volts), e.g., voltages of 600 V, 1200 V or more and/or are rated to conduct currents of at least 1 A, e.g., currents of 10 A, 50 A, 100 A or more.

In the depicted embodiment, the semiconductor packaging assembly 100 comprises first and second transistor dies 138 mounted on opposite sides of the first axis of symmetry 132. For the purposes of this discussion, the first and second transistor dies 138 can be regarded as the two transistor dies 138 on the left side of the gate distribution pad 128 in FIG. 2, wherein the first discrete transistor die 138 refers to the lower one of the dies and the second discrete transistor die 138 refers to the upper one of the dies. The first and second transistor dies 138 may be nominally identical to one another. To this end, each of the first and second transistor dies 138 comprise a first load terminal (not seen in the figure) disposed on a rear surface of the respective die that faces the die pad 102 and comprise a second load terminal 142 and a gate terminal 144 disposed on an upper surface of the respective die that faces away from the die pad 102. Thus, the first and second transistor dies 138 are configured as vertical devices that are configured to conduct a load current between opposite facing main and rear surfaces of the die. The first load terminal and the second load terminal 142 refer to the voltage blocking terminals of the device, e.g., the source and drain in the case of a MOSFET, collector and emitter in the case of an IGBT, and so forth. The orientation of the first load terminal and the second load terminal 142 may be reversed such that the terminal facing the die pad 102 can be the source or drain, collector or emitter, and so forth. The gate terminal 144 is configured to control a conductive connection between the load terminals of each discrete transistor die 138 in a commonly known manner.

The first and second transistor dies 138 may be mounted on the die pad 102 in a symmetrical manner and/or with equidistant spacings to other features of the package arrangement. For example, the first and second transistor dies 138 may be substantially equidistant to the first axis of symmetry 132, meaning that the separation distance between each die and the first axis of symmetry 132 is the same. Separately or in combination, the first and second transistor dies 138 can be arranged to be substantially equidistant to the first and second elongated rails 122, 124, meaning that the separation distance between the first discrete transistor die 138 and the first rail 122 is substantially the same as the separation distance between the second discrete transistor die 140 and the second rail 124. Separately or in combination, the first and second transistor dies 138 can be arranged to be substantially equidistant to the gate distribution pad 128, meaning that the separation distance between the first discrete transistor die 138 and a closest edge location of the gate distribution pad 128 to the first discrete transistor die 138 is the substantially the same as the separation distance between the second discrete transistor die 140 and a closest edge location of the gate distribution pad 128 to the second discrete transistor die 140.

In the depicted embodiment, the semiconductor packaging assembly 100 additionally comprises third and fourth transistor dies 138 mounted on the die pad 102 as well. For the purposes of this discussion, the third and fourth transistor dies 138 can be regarded as the two transistor dies 138 on the right side of the gate distribution pad 128 in FIG. 2, wherein the third discrete transistor die 138 refers to the upper one of the dies and the fourth discrete transistor die 138 refers to the lower one of the dies. The third and fourth transistor dies 138 may be nominally identical to the first and second transistor dies 138 and/or to one another. Moreover, the third and fourth transistor dies 138 can be substantially equidistant to the first axis of symmetry 132, can be substantially equidistant to the first and second elongated rails 122, 124, and can be substantially equidistant to the gate distribution pad 128, e.g., in a similar manner as discussed above with reference to the first and second transistor dies 138. In an embodiment, all four of the first, second, third and fourth transistor dies 138 are substantially equidistant to the gate distribution pad 128. The below discussion assumes an arrangement comprising all four of the first, second, third and fourth transistor dies 138. However, the discussion is equally applicable to an embodiment comprising only two transistor dies 138 arranged on either side of the first axis of symmetry 132.

Each of the first, second, third and fourth transistor dies 138 are connected in parallel with one another by electrical interconnections. The electrical interconnections electrically connect the leads with common terminals of the transistor dies 138. That is, the first load terminals of the first, second, third and fourth transistor dies 138 represent a first group of common terminals that are each electrically connected the same lead, the second load terminals 142 of the first, second, third and fourth transistor dies 138 represent a second group of common terminals that are each electrically connected to the same lead, and the gate terminals 144 of the first, second, third and fourth transistor dies 138 represent a third group of common terminals that are each electrically connected to the same lead. As a result, the first, second, third and fourth transistor dies 138 are arranged configured to operate in unison with one another to control a conductive connection between the first and second voltage supply leads 112, 118.

The electrical connections comprise a gate connection that connects the gate terminals 144 of the first, second, third and fourth transistor dies 138 with the gate lead 105. The gate connection comprises first and second common interconnect elements 150, 152 that are each connected between the gate lead 105 and the gate distribution pad 128. The first common interconnect element 150 is connected between the gate landing pad 126 and the second gate connection pad 130. The second common interconnect element 152 is connected between the second gate connection pad 130 and the second landing pad 120. The gate connection additionally comprises first, second, third and fourth interconnect elements 154, 156, 158, 160 connected between the gate distribution pad 128 and the gate terminals 144 of the first, second, third and fourth transistor dies 138, respectively. Thus, the gate signal is transmitted collectively from the gate lead 105 to the gate distribution pad 128 via the first and second common interconnect elements 150, 152 and then fans out individually to each of the first, second, third and fourth transistor dies 138 via the first, second, third and fourth interconnect elements 154, 156, 158, 160.

The electrical connections further comprise a first DC voltage connection that connects the first load terminals from the first, second, third and fourth transistor dies 138 with the first DC voltage lead 107. Due to the vertical configuration of the transistor dies 138, the first DC voltage connection can be provided directly by the first DC voltage pad 112. The die pad 102 can be connected with the first load terminals from the first, second, third and fourth transistor dies 138 by a conductive adhesive, e.g., solder, sinter, etc.

The electrical connections further comprise a second DC voltage connection that connects the second load terminals 142 from the first, second, third and fourth transistor dies 138 with the second DC voltage lead 109. The second DC voltage connection is provided by the second DC voltage pad 118 comprising the second landing pad 120 that is in conductive contact with the second DC voltage lead 109. The second DC voltage connection is additionally provided by first, second, third and fourth bridge connections 162, 164, 166, 168. The first bridge connection 162 is provided by a group of interconnect elements connected between the first rail 122 and the second load terminal 142 of the first discrete transistor die 138, the second bridge connection 164 is provided by a group of interconnect elements connected between the second rail 124 and the second load terminal 142 of the second discrete transistor die 140, the third bridge connection 166 is provided by a group of interconnect elements connected between the first rail 122 and the second load terminal 142 of the third discrete transistor die 138, and the fourth bridge connection 168 is provided by a group of interconnect elements connected between the second rail 124 and the second load terminal 142 of the fourth discrete transistor die 138.

According to an embodiment, one or more of the electrical interconnections has a balanced configuration that provides substantially identical electrical impedance as between the common terminals of at least two of the transistor dies 138 and the lead 104 to which they are connected. That is, the electrical impedance between a given terminal of one of the transistor dies 138 and the lead associated with this given terminal is substantially the same as the electrical impedance between the same terminal from a different one of the transistor dies 138 and the lead associated with this given terminal. As will be explained, the balanced interconnections may be provided to pairs of the transistor dies 138 arranged on opposite sides of the first axis of symmetry, e.g., the first and second transistor dies 138 or the third and fourth transistor dies 138, or in some cases may be provided to multiple pairs of the transistor dies 138 arranged on opposite sides of the first axis of symmetry, e.g., all four of the first, second, third and fourth transistor dies 138. In an embodiment, each of the gate connection, the first DC voltage connection and the second DC voltage connection may have the balanced configuration, meaning for each of these connections, the impedance to at least two of the transistor dies 138 is at least substantially identical.

According to an embodiment, at least one of the gate connection, the first DC voltage connection, and the second DC voltage connection comprises electrically conductive elements or regions that are symmetrically arranged with respect to the first axis of symmetry 132. This symmetrical arrangement facilitates the balanced configuration by mimicking the conductors on either side of the first axis of symmetry 132. That is, current flows through a conductive element with the same geometry and arrangement on either side of the first axis of symmetry 132. As explained above, any one or more of the first DC voltage pad 112, the second DC voltage pad 118 and the gate distribution 128 can be symmetrically arranged with respect to the first axis of symmetry 132, thus allowing for symmetric current flow on either side of the first axis of symmetry 132. Separately or in combination, the interconnect elements used to form these connections can also be symmetrically arranged with respect to the first axis of symmetry 132.

In an embodiment wherein the gate connection has the balanced configuration, a substantially identical electrical impedance as between the gate terminals 144 of two or more transistor dies 138 may be realized the following way. Each of the interconnect elements that connect the two or more transistor dies 138 to the gate distribution pad 128 may have substantially identical electrical impedance. For example, each of the first, second, third and fourth interconnect elements 154, 156, 158, 160 may be bond wires, clips, ribbons etc. of the same type and length. The first and second interconnect elements 154, 156 can also be symmetrically arranged with respect to the first axis of symmetry 132. Likewise, the third and fourth interconnect elements 158, 160 can also be symmetrically arranged with respect to the first axis of symmetry 132. As a result, an identical impedance connection is provided between each of the gate terminals 144. Thus, the gate connection may have the balanced configuration with respect to all four of the first, second, third and fourth transistor dies 138. The location of the gate distribution pad 128 within the die pad 102 advantageously makes it possible to have these identical electrical length and symmetric gate connections. Meanwhile, the remaining part of the gate connection is provided by the gate distribution pad 128, the first common interconnect element 150, the second gate connection pad 130, and the second common interconnect element 152, each of which present the same impedance to each transistor die. By providing the second gate connection pad 130 as an intermediary contact point for the gate connection, inductive coupling between the gate connection interconnect elements and the electrical interconnect elements from the bridge connections may be minimized. In other embodiments, the second gate connection pad 130 can be omitted and a direct connection between the gate landing pad 126 and the gate distribution pad 128 can be provided.

In an embodiment wherein the first DC voltage connection has the balanced configuration, a substantially identical electrical impedance as between the first load terminals of the transistor dies 138 may be obtained in the following way. The symmetric geometry of the first DC voltage pad 112 means that an identical connection geometry is provided on either side of the axis of symmetry. Thus, for a given pair of the transistor dies 138 that are mounted on the die pad 102 and arranged on either side of the axis of symmetry and arranged equidistant to the interior contact fingers 117 of the first DC voltage lead 107, i.e., the first and second transistor dies 138 or the third and fourth transistor dies 138, an equivalent impedance connection is provided.

In an embodiment wherein the second DC voltage connection has the balanced configuration, a substantially identical electrical impedance as between the second load terminals 142 of the transistor dies 138 may be obtained in the following way. Each pair of bridge connections that connect with pairs of transistor dies 138 that are arranged on opposite sides of the axis of symmetry and are arranged equidistant to the first DC voltage lead 107 may have substantially identical electrical impedance. For example, each of the first and second bridge connections 162, 164 may comprise the same number of equal length bond wires, thus providing an identical connection between the second load terminals 142 of the first and second transistor dies 138 and the second DC voltage pad 118. Likewise, each of the third and fourth bridge connections 166, 168 may comprise the same number and length bond wires, thus providing an identical DC connection between the second load terminals 142 of the first and second transistor dies 138 and the second DC voltage pad 118. The interconnect elements of the first and second bridge connections 162, 164 can also be symmetrically arranged with respect to the first axis of symmetry 132 and the interconnect elements of the third and fourth bridge connections 166, 168 can be symmetrically arranged with respect to the first axis of symmetry 132. The slight asymmetry of the second landing pad 120 portion of the second DC voltage pad 118 may result in a slightly different impedance of the second DC voltage connection as between the first and second transistor discrete dies 138, 140 and as between the third and fourth transistor dies 138. However, this impedance may be substantially similar, e.g., less than 5%, typically within 2% of the same resistance, capacitance, inductance, or any combination thereof. Moreover, minor adjustments to the bridge connections may be made to compensate for this discrepancy, e.g., by tailoring bond wire height, length, etc.

Figure 3:
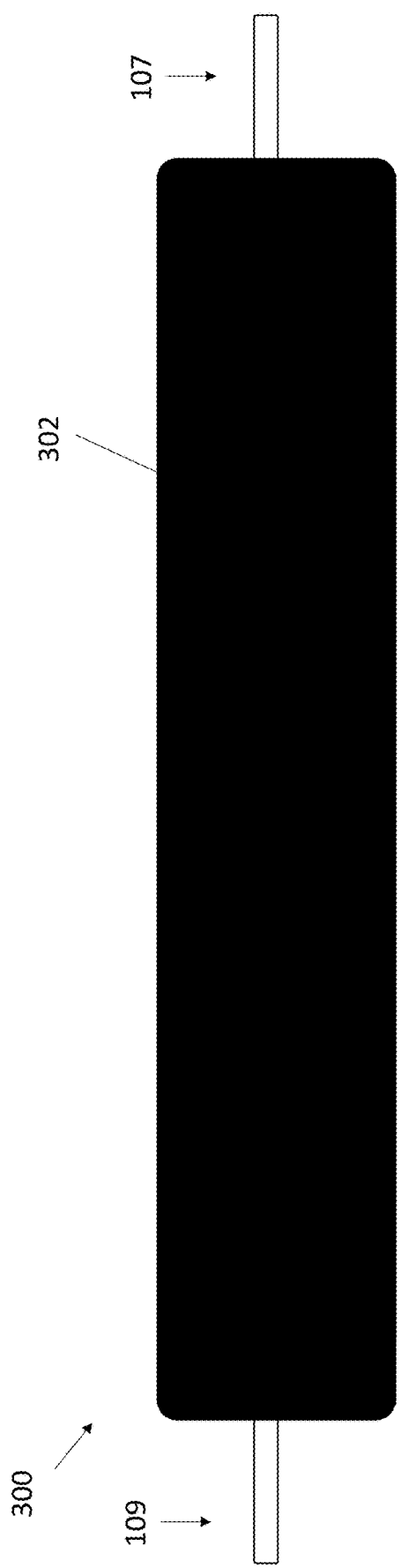
FIG. 3 illustrates a semiconductor package, according to an embodiment.

Referring to FIG. 3, after mounting the transistor dies 138 and forming the electrical interconnections, a semiconductor package 300 may be completed by forming an encapsulant body 302 that encapsulates each one of the transistor dies 138 and associated electrical connections. The encapsulant body 302 may comprise an electrically insulating encapsulant material, e.g., mold compound, epoxy, thermosetting plastic, etc. that is formed by a molding technique, e.g., compression molding, transfer molding, injection molding, etc. The leads protrude out from the encapsulant body 302 and thus form externally accessible points of electrical contact. The semiconductor package may have a variety of lead configurations in addition to the depicted embodiment, examples of which include surface mount device (SMD) configurations, through hole configurations, bent lead configurations, etc.

Figure 4:
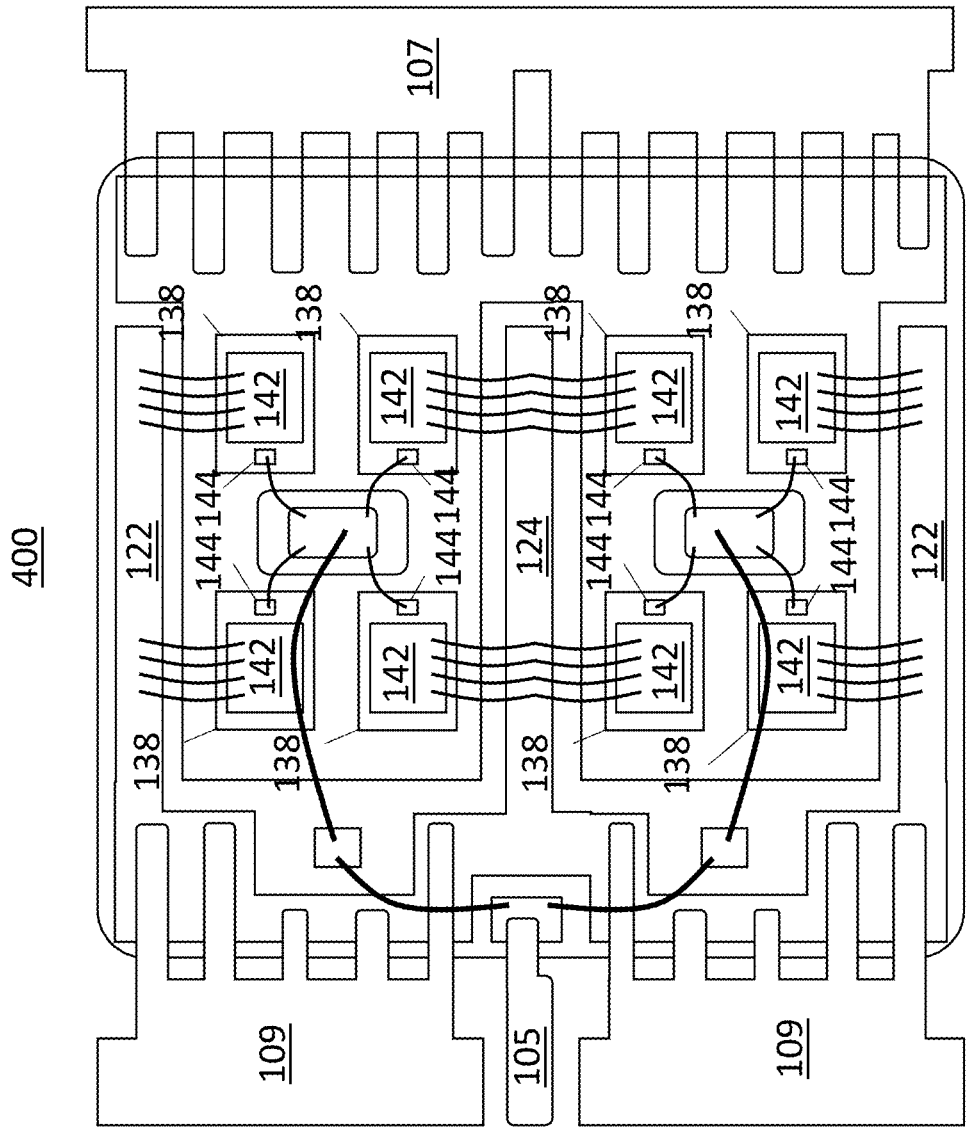
FIG. 4 illustrates a semiconductor packaging assembly from a plan-view perspective, according to another embodiment.

Referring to FIG. 4, a semiconductor packaging assembly 400 is shown, according to another embodiment. The semiconductor packaging assembly 400 uses the layout of the semiconductor packaging assembly 100 described with reference to FIGS. 1 and 2 as a unit cell and repeats the basic arrangement to provide two groups of four transistor dies 138 that are all connected in parallel. As shown, semiconductor packaging assembly 400 comprises two of the second DC voltage leads 109 that are separated from one other by the gate lead 105. These two groups may be connected to the same potential from outside the package or may be connected to one another by another interconnect element (not shown) such as a metal clip. As can be seen, the lower group of transistor dies 138 can share the second rail 124 with the upper group of transistor dies 138, thus allowing for improved space efficiency in comparison to a complete replication of the two arrangements. This multi-cell concept can be used to create any number of parallel-connected devices.

Figure 5:
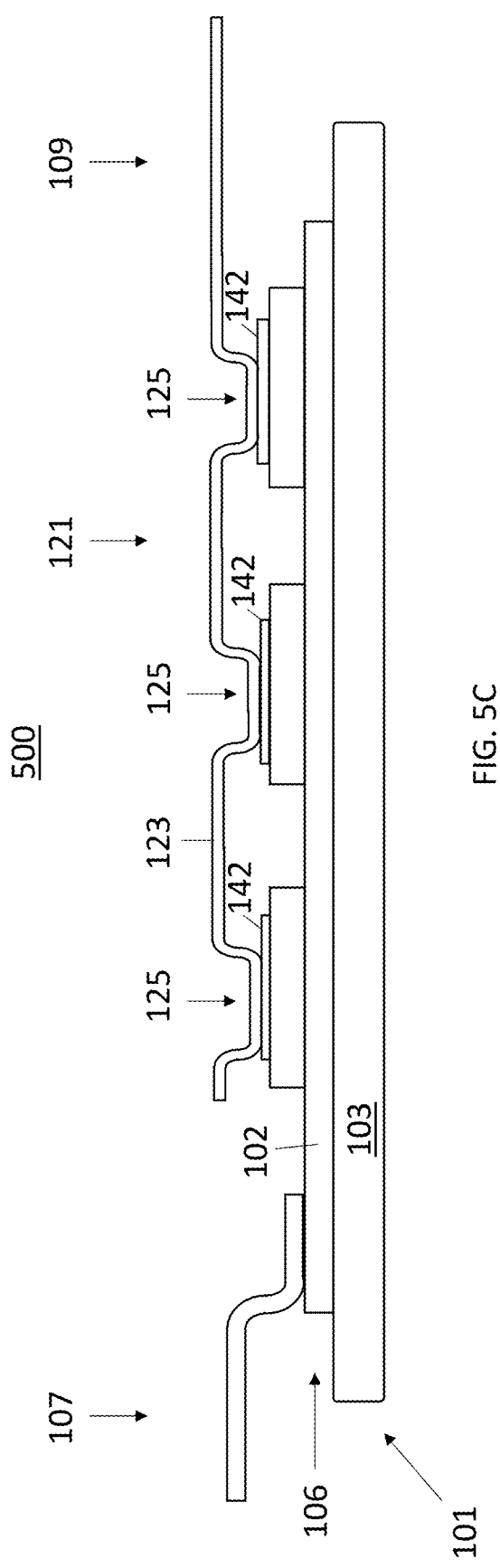
FIG. 5, which includes

Referring to FIG. 5, a semiconductor packaging assembly 500 is shown, according to another embodiment. As shown in FIG. 5A, the substrate 100 is configured such that the die pad 102 is provided by a single layer of metal which is the only metal region on an upper surface of the base pad 101. That is, the substrate 100 includes a single unstructured region of metal on the base pad 101 and this unstructured region is used for the die pad 102. The substrate 100 may be easier to produce and/or less costly than the previously described substrate 100 comprising the structured metal layer 106. Unlike the previously described embodiments, the substrate 100 is not used to provide any of the electrical interconnections apart from the first DC voltage connection inside the package. Instead, these connections are provided by a single continuous lead frame 157 that comprises the gate lead 105, the first DC voltage lead 107, and the second DC voltage lead 109, and comprises internal metal spans that extend over the substrate 100 and are used to effectuate the electrical interconnections.

As shown in FIG. 5B, the semiconductor packaging assembly 500 comprises plurality of transistor dies 138 mounted on the die pad 102. In the depicted embodiment, three of the transistor dies 138 are mounted on the die pad 102. More generally, any number of the transistor dies 138 can be mounted on the die pad. Each of the transistor dies 138 are connected in parallel with one another by electrical interconnections. In particular, the gate lead 105 is electrically connected to the gate terminals 144 of the transistor dies 138, the first DC voltage lead 107 is electrically connected to the first load terminals from the transistor dies 138 via the die pad 102, and the second DC voltage lead 109 is electrically connected to the second load terminals 142 from the transistor dies 138.

The lead frame 157 comprises a continuous gate structure that forms the gate lead 105 and comprises an internal gate runner 119 that extends over the substrate 101. The gate terminals 144 of each of the transistor dies 138 are electrically connected to the internal gate runner 119 by interconnect elements 121, thus completing the gate connection. The semiconductor packaging assembly 500 comprising the internal gate runner 119 may be configured such that the gate connection has a balanced configuration that provides identical or substantially identical electrical impedance as between the gate terminals 144 of each of the transistor dies 138 and the gate lead 105 in the following way. The bonding placement of the interconnect elements 121 and/or the placement of the transistor dies 138 can be selected to balance the impedance. As shown, the interconnect elements 121 are bonded in such a way that the transistor dies 138 that are closer to the gate lead 105 have longer interconnect elements 121. This technique can be used to compensate for the difference in the effective length of the internal gate runner 119 which forms the gate connection for each of the transistor dies 138. A similar effect may be obtained by placement of the transistor ties, e.g., by staggering the separation distance between the transistor dies 138 and the interconnect elements 121 such that the transistor dies 138 that are closer to the gate lead 105 are further away from the internal gate runner 119.

The lead frame 157 comprises a continuous first DC voltage structure that forms the first DC voltage lead 107 and comprises an internal connection span 121 that extends over the substrate 101 and forms a direct ohmic contact with the die pad 102. In this way, the first DC voltage lead 107 is electrically connected to the first load terminals from the transistor dies 138 via the die pad 102.

The lead frame 157 comprises a continuous second DC voltage structure that extends over the substrate 101 and comprises an internal second DC connection span 121. As shown in FIG. 5C, the internal second DC connection span 121 comprises a planar section 123 that is spaced apart from each of the transistor dies 138 and depressions 125 that protrude away from the planar section 123. The depressions 125 form a direct ohmic contact with the second load terminals 142 from the transistor dies 138. A conductive adhesive, e.g., solder, sinter, glue, etc., may be used to effectuate these electrical connections.

Referring to FIG. 6, selected method steps for forming a semiconductor package 600 from the semiconductor packaging assembly 500 are shown.

As shown in FIG. 6A, the substrate 101 is provided and the transistor dies 138 are arranged on the die pad 102 with the first load terminals facing the die pad 102 and the second load terminals 142 and the gate terminals 144 facing away from the die pad 102.

As shown in FIG. 6B, the lead frame 157 is provided. The lead frame 157 can be provided from a sheet metal that is processed, e.g., by stamping, punching, etching, etc., to comprise the continuous gate structure, the continuous first DC voltage structure, and the continuous second DC voltage structure with the requisite geometry. The lead frame 157 comprises an external peripheral ring or so-called dam bar and tie bar structures to physically support the leads before the encapsulation process. The lead frame 157 is arranged over the substrate 101 with the internal connection span 121 of the second DC voltage structure directly over the transistor dies 138 and the connection span 121 of the first DC voltage structure over a region of the die pad 102 adjacent to the transistor dies 138. The lead frame 157 can be attached to the assembly using a conductive attachment material, e.g., solder, sinter, etc. to form the first DC voltage connection and the second DC voltage connection. According to an embodiment, these electrical connections can be formed simultaneously. For example, a single solder reflow step can be formed to effectuate any one or more of the following electrical connections: the electrical connections between the depressions 125 and the second load terminals 142, the electrical connections between the first load terminals of the transistor dies 138 and the die pad 102, and the electrical connections between the connection span 121 of the first DC voltage structure and the die pad 102. A similar technique may be used to form these connections simultaneously by another attachment material, e.g., sinter.

As shown in FIG. 6C, the interconnect elements 121 are provided and connected between the gate terminals 144 and the internal gate runner 119. This may comprise a wire bonding process in the case of bond wires (as shown). According to an embodiment, the semiconductor package 600 may comprise press-fit connectors 127 (depicted in FIG. 7). In that case, base regions of the press-fit connectors 127 can be attached to an upper surface of the lead frame 157 using an electrical and mechanical joining technique, e.g., soldering, welding, brazing, etc. Exemplary attachment locations 129 for the press-fit connectors 127 are shown in FIG. 6C.

Figure 7:
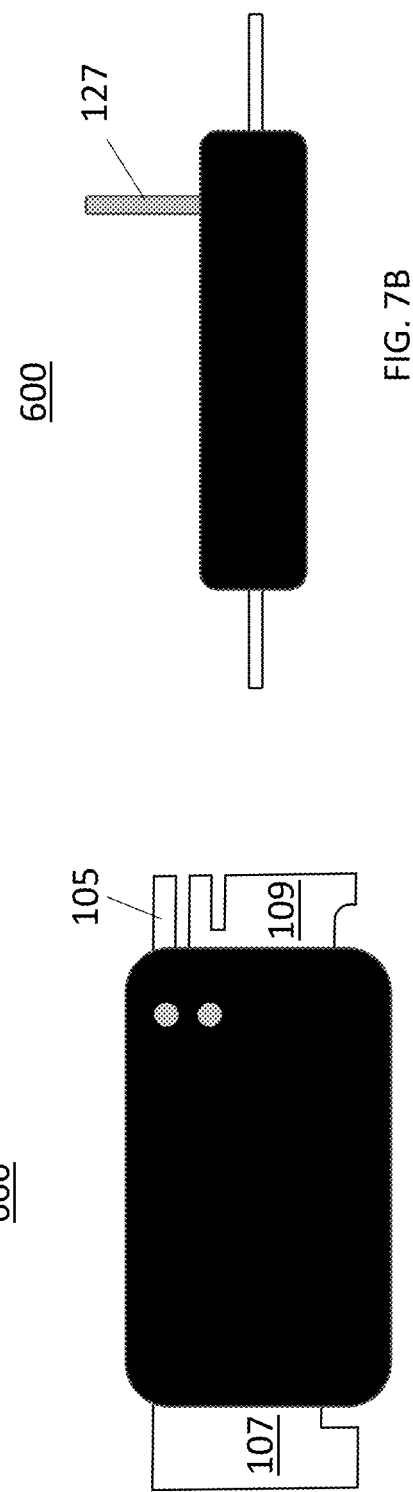
FIG. 7, which includes

Referring to FIG. 7, a complete semiconductor package 600 formed from the semiconductor packaging assembly 500 described with reference to FIG. 5 is shown. The semiconductor package 600 comprises an encapsulant body 302 that is formed after attaching the lead frame 157 to the substrate 101. The semiconductor package 600 comprises press-fit connectors 127 that protrude out from an upper surface of the encapsulant body that extends over the substrate 101. The press-fit connectors 127 are electrically conductive structures formed of a conductive material, e.g., copper, aluminum, etc. The press-fit connectors 127 are configured to be inserted in and received by an external apparatus, such as a socket, and form a secure mechanical and electrical connection thereto. The outer ends of the press-fit connectors 127 may comprise features such as spring-loaded mechanisms to facilitate this connection. The press-fit connectors 127 thus represent alternate points of electrical contact in addition to the leads. The press-fit connectors 127 can be arranged at any location and can provided secondary connections in parallel to the leads or can supplant any one or more of the leads.

Figure 8:
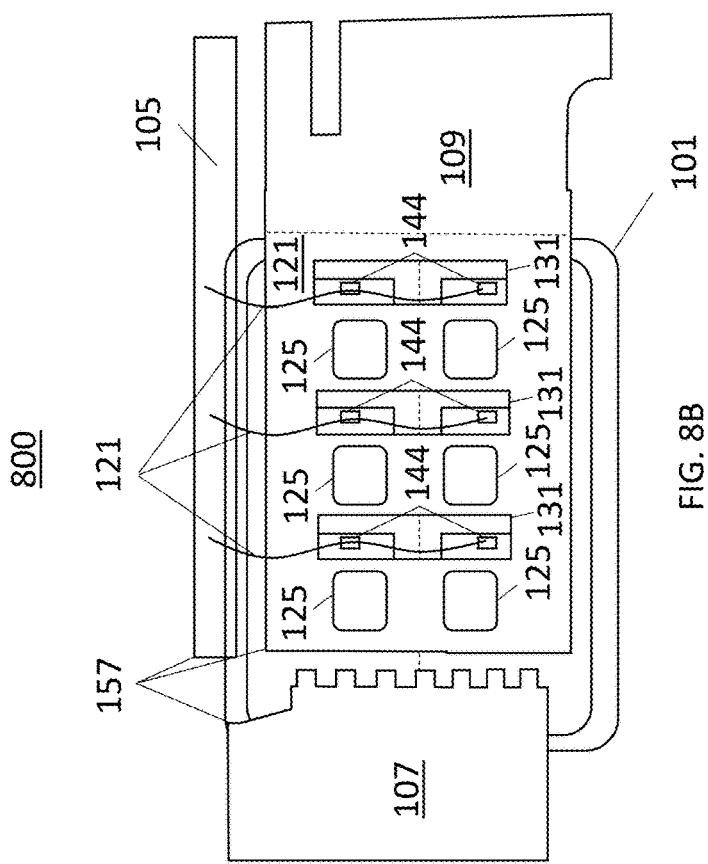
FIGS. 8A and 8B, illustrates a semiconductor packaging assembly, according to an embodiment.
Figure 8:
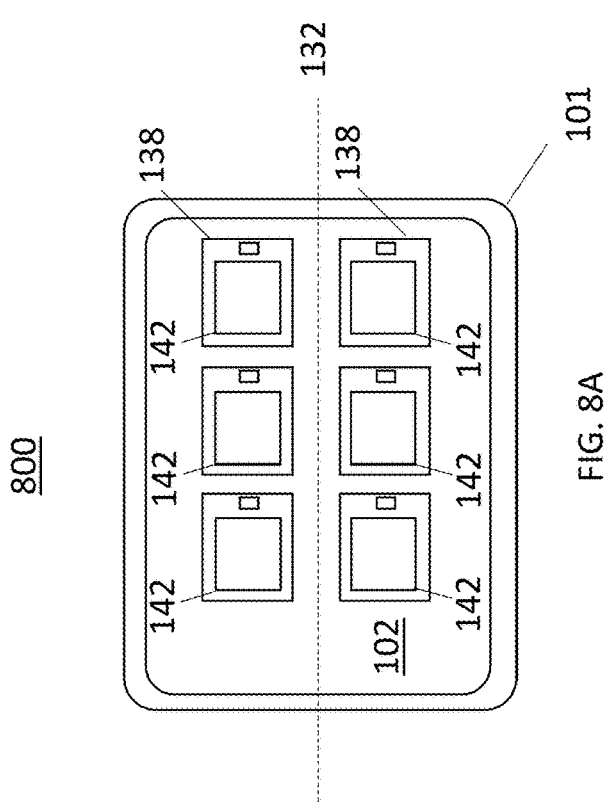

Referring to FIG. 8, a semiconductor packaging assembly 800 is shown, according to another embodiment. The semiconductor packaging assembly 800 is similar to the semiconductor packaging assembly 500 described with reference to FIG. 5, except that the transistor dies 138 are arranged in pairs that are vertically aligned with one another in a direction that is orthogonal to the current flow direction. This arrangement can be used provide the first DC voltage connection and the second DC voltage connection to have the balanced configuration as between pairs of the transistor dies 138, as described above. As shown, the semiconductor packaging assembly 800 comprises six of the transistor dies 138, with three pairs that are vertically aligned with one another in a direction that is transverse to the load current flow direction. In principle, this concept can be extended to any number of pairs. The transistor dies 138 may be mounted on the die pad 102 in a symmetrical manner and/or with equidistant spacings to other features of the package arrangement. For example, the transistor dies 138 for each pair may be arranged on opposite sides of a first axis of symmetry 132 and may be substantially equidistant to the first axis of symmetry 132 in a similar manner as previously described.

Referring to FIG. 8B, the lead frame 157 may be adapted to accommodate the arrangement of the transistor dies 138. As shown, the internal second DC connection span 121 comprises openings 131 that are arranged over the gate terminals 144 from the transistor dies 138, thereby allowing for the interconnect elements 121 to reach each of the gate terminals 144. The gate connection for each pair of the transistor dies 138 can be effectuated by a single interconnect element 121. For instance, a single bond wire can be provided, e.g., using a wedge-wedge or ball-wedge bonding technique.

Referring to 9, a semiconductor packaging assembly 900 is shown, according to another embodiment. The semiconductor packaging assembly 900 is similar to the previously described embodiments described with reference to FIGS. 5 and 8 in that the substrate 100 is configured such that the die pad 102 is provided by a single layer of metal which is the only metal region on an upper surface of the base pad 101. Moreover, the semiconductor packaging assembly 900 is similar to the previously described embodiments described with reference to FIGS. 5 and 8 in that a single continuous lead frame 157 that comprises the gate lead 105, the first DC voltage lead 107, and the second DC voltage lead 109, and comprises internal metal spans that extend over the substrate 100 is used to effectuate the electrical interconnections.

The semiconductor packaging assembly 900 comprises a plurality of transistor dies 138 mounted on the die pad 102. In the depicted embodiment, the semiconductor packaging assembly 900 comprises four of the transistor dies 138 mounted on the die pad. These transistor dies 138 may be mounted relative to a first axis of symmetry 132 in a similar manner as the first, second, third and fourth transistor dies 138 in the semiconductor packaging assembly 100 described with reference to FIG. 1. More generally, any number of the transistor dies 138 can be mounted on the die pad 102.

The lead frame 157 from the semiconductor packaging assembly 900 is configured such that the second DC voltage connection is provided by a continuous second DC voltage structure that extends over the base pad 103 and comprises first and second elongated rails 135, 137. The first and second elongated rails 135, 137 form a u-shaped structure in a similar manner as the first and second rails 122, 124 in the embodiment described with reference to FIGS. 1 and 2. This arrangement may provide a balanced impedance configuration as between the second load terminals 142 from pairs of the transistor dies 138 on either side of the first axis of symmetry 132 in a similar manner as described with reference to FIGS. 1 and 2.

Figure 9:
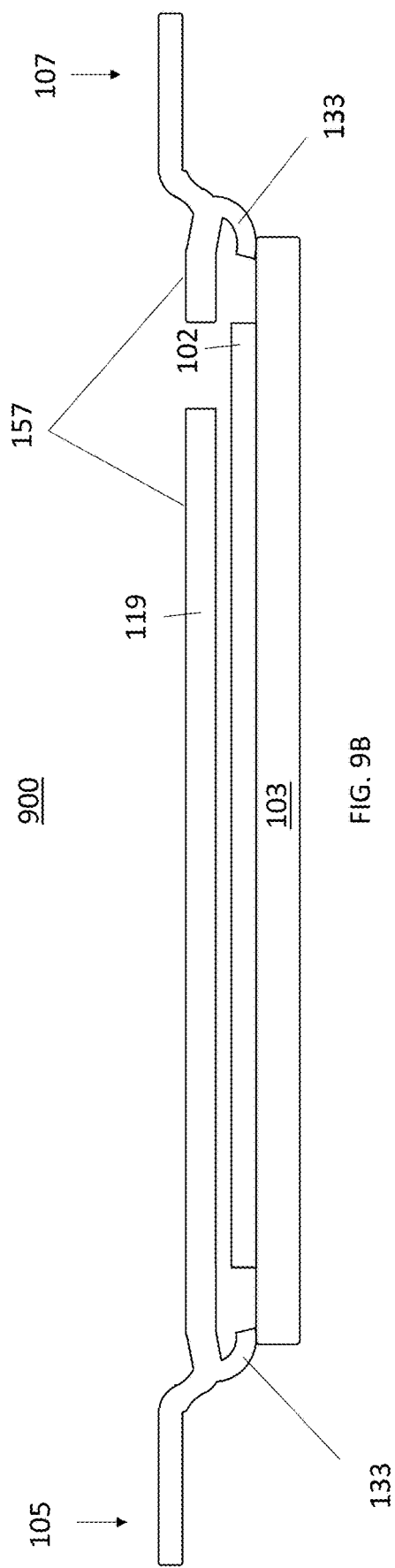
FIG. 9, which includes

In this embodiment, the lead frame 157 is configured such that the first and second elongated rails 135, 137 that provide the second DC voltage connection extend directly over the die pad 102. That is, the first and second elongated rails 135, 137 are vertically above and spaced apart from the die pad 102. Electrical isolation between the two structures may be provided by the encapsulant 302 after the encapsulation process is performed. The lead frame 157 comprises prongs 133 that facilitate the configuration of the lead frame with structures that extend freestanding over the die pad 102. The prongs 133 are part of the same structure which forms the gate lead 105, the first DC voltage lead 107, and the second DC voltage lead 109. The prongs 133 extend downward from the plane of the rest of the lead frame 157 (as shown in FIG. 9B) and contact the base layer 103. The prongs 133 physically support the lead frame 157 during assembly and before encapsulation. The prongs 133 may be mechanically attached to the base pad 101, e.g., by an adhesive, or alternatively may simply rest on the base pad 101 until the lead frame 157 is secured in place by the encapsulation process.

The second load terminals 142 from each of the transistor dies 138 can be electrically connected to one or both of the first and second elongated rails 135, 137 by interconnect elements. As shown, the second load terminals 142 from pairs of the transistor dies 138 on either side of the first axis of symmetry are connected to both of the first and second elongated rails 135, 137 by ribbons 159. Instead of ribbons 169, any type of interconnect element may be used to complete this connection. By providing the continuous second DC voltage structure with the first and second elongated rails 135, 137 to be directly over and vertically spaced apart from the die pad 102, only a short length is needed to complete the interconnection with the second load terminals 142 and hence the impedance of the interconnections is lowered. Moreover, by providing the first and second elongated rails 135, 137 to be directly over and vertically spaced apart from the die pad 102, the area of the die pad 102 can expand beyond the immediate vicinity of the transistor dies 138. This allows for the transistor dies 138 to be mounted on a larger die pad 102 with greater area for heat spreading, and hence improved thermal dissipation.

The gate lead 105 is part of a continuous gate metal structure that extends over the base pad 103 and comprises an internal gate runner 119. The gate terminals 144 from each of the transistor dies 138 can be electrically connected internal gate runner 119 by bond wires 161 For instance, a single bond wire 161 can be provided, e.g., using a wedge-wedge or ball-wedge bonding technique. Instead of using bond wires, any type of interconnect element can be used to complete this connection. As shown, the internal gate runner 119 runs alongside the second elongated rail 137. In other embodiments, the internal gate runner 119 may run alongside the first elongated rail 135. In either case, the vertical separation of the lead frame 157 allows for the internal gate runner 119 to be closer to the transistor dies 138, thus lowering the impedance of the gate connection. The internal gate runner 119 may directly overlap with the base pad 101

(as shown) and in other embodiments may also directly overlap with the die pad 102.

The first DC voltage lead 107 is part of a continuous first DC voltage structure that comprises an interior pad 139. The first DC voltage lead 107 is electrically connected to the die pad 102 and hence to the first load terminals of the transistor dies 138 by a group of interconnect elements 121 that are connected between the interior pad 139 and the die pad 102. The continuous first DC voltage structure and the group of interconnect elements 121 may be symmetric relative to the first axis of symmetry 132.

The first DC voltage connection may have a balanced connection whereby for a given pair of the transistor dies 138 that are mounted on the die pad 102 and arranged on either side of the first axis of symmetry 132 and arranged equidistant to the interconnect elements 121 that contact the die pad 102, an equivalent impedance connection is provided.

Although the present disclosure is not so limited, the following numbered examples demonstrate one or more aspects of the disclosure.

Example 1. A semiconductor package, comprising a substrate comprising a die pad, first and second discrete transistor dies mounted on the die pad, an encapsulant body that encapsulates the first and second discrete transistor dies, and a plurality of leads that are exposed from the encapsulant body, wherein the first and second discrete transistor dies are connected in parallel with one another by electrical interconnections that electrically connect common terminals of the first and second discrete transistor dies to one of the leads, and wherein at least one of the electrical interconnections has a balanced configuration that provides substantially identical electrical impedance as between the common terminals of the first and second discrete transistor dies and the lead to which they are connected.

Example 2. The semiconductor package of example 1, wherein each of the first and second discrete transistor dies comprise: first load terminals that face and electrically connect with the die pad; and second load terminals and gate terminals that face away from the die pad.

Example 3. The semiconductor package of example 2, wherein the plurality of leads comprises a first DC voltage lead, a second DC voltage lead, and a gate lead, and wherein the electrical interconnections comprise: a gate connection that connects the gate terminals of the first and second discrete transistor dies with the gate lead; a first DC voltage connection that connects the first load terminals of the first and second discrete transistor dies with the first DC voltage lead; and a second DC voltage connection that connects the second load terminals of the first and second discrete transistor dies with the second DC voltage lead, and wherein one or more of the gate connection, the first DC voltage connection, and the second DC voltage connection has the balanced configuration.

Example 4. The semiconductor package of example 3, wherein the substrate comprises a base pad of electrically isolating material and a structured metallization layer disposed on the base pad, and wherein the die pad is formed in the structured metallization layer.

Example 5. The semiconductor package of example 4, wherein the structured metallization layer comprises a gate distribution pad that is arranged within the die pad, and wherein the gate connection has the balanced configuration.

Example 6. The semiconductor package of example 5, wherein the gate connection comprises: a common interconnect element connected between the gate lead and the gate distribution pad; and first and second interconnect elements connected between the gate distribution pad and the gate terminals of the first and second discrete transistor dies, respectively, and wherein the first and second interconnect elements have substantially identical electrical impedance.

Example 7. The semiconductor package of example 5, further comprising third and fourth discrete transistor dies mounted on the die pad, wherein the third and fourth discrete transistor dies each comprise first load terminals that face and electrically connect with the die pad and second load terminals and gate terminals that face away from the die pad, wherein the gate connection connects the gate terminals of the third and fourth discrete transistor dies with the gate lead, and wherein the gate connection provides substantially identical electrical impedance as between the gate terminals of the first, second, third and fourth discrete transistor dies and the gate lead.

Example 8. The semiconductor package of example 3, wherein the first DC voltage connection has the balanced configuration.

Example 9. The semiconductor package of example 3, wherein the second DC voltage connection comprises first and second elongated rails that form a u-shaped geometry, and wherein the second DC voltage connection has the balanced configuration.

Example 10. The semiconductor package of example 8, further comprising: a first electrical interconnection between the first rail and the second load terminal of the first discrete transistor die; and a second electrical interconnection between the second rail and the second load terminal of the second discrete transistor die, wherein the first and second electrical interconnections have substantially identical electrical impedance.

Example 11. The semiconductor package of example 3, wherein the substrate comprises a base pad of electrically isolating material and the die pad is provided by a single layer of metal which is the only metal region on an upper surface of the base pad.

Example 12. The semiconductor package of example 11, wherein the semiconductor package comprises a lead frame, wherein the lead frame is configured such that the gate lead is part of a continuous metal structure that comprises an internal runner that extends across an edge side of the substrate, and wherein the gate connection comprises interconnect elements connected between the gate terminals of the first and second discrete transistor dies and the internal runner.

Example 13. A semiconductor package, comprising: a substrate comprising a die pad; first and second discrete transistor dies mounted on the die pad; an encapsulant body that encapsulates the first and second discrete transistor dies; and a plurality of leads that are exposed from the encapsulant body, the plurality of leads comprising a gate lead, a first DC voltage lead, and a second DC voltage lead; a gate connection between the gate lead and gate terminals of the first and second discrete transistor dies; a first DC voltage connection between the first DC voltage lead and first load terminals of the first and second discrete transistor dies; and a second DC voltage connection between the second DC voltage lead and second load terminals of the first and second discrete transistor dies, wherein the first and second discrete transistor dies are arranged on opposite sides of a first axis of symmetry, and wherein at least one of the gate connection, the first DC voltage connection, and the second DC voltage connection comprises electrically conductive elements or regions that are symmetrically arranged with respect to the first axis of symmetry.

Example 14. The semiconductor package of example 13, wherein the substrate comprises a base pad of electrically insulating material and a structured metallization layer disposed on the base pad, and wherein the die pad is formed in the structured metallization layer, wherein the structured metallization layer comprises a gate distribution pad that is arranged within the die pad, and wherein the gate connection comprises: first and second interconnect elements connected between the gate distribution pad and the gate terminals of the first and second discrete transistor dies, respectively, and wherein the first and second discrete transistor dies are each arranged substantially equidistant to the gate distribution pad.

Example 15. The semiconductor package of example 13, wherein the semiconductor package comprises a lead frame, wherein the lead frame comprises a continuous metal structure comprising the gate lead and an internal runner that extends over the substrate and is spaced apart from the die pad, and wherein the gate connection comprises interconnect elements connected between the gate terminals of the first and second discrete transistor dies and the internal runner.

Example 16. A semiconductor package, comprising: a substrate comprising a die pad of metal; first and second discrete transistor dies mounted on the die pad, each of the first and second discrete transistor dies comprising first load terminals that face and electrically connect with the die pad and second load terminals and gate terminals that face away from the die pad; a gate lead that is electrically connected to the gate terminals of the first and second transistor dies; a first DC voltage lead that is electrically connected to the first load terminals from the first and second discrete transistor dies via the die pad; and a second DC voltage lead that is electrically connected to the second load terminals from the first and second discrete transistor dies, wherein the gate lead is part of a continuous gate metal structure that extends over the substrate and comprises an internal gate runner, and wherein the gate terminals of the first and second transistor dies are electrically connected to the internal runner by interconnect elements.

Example 17. The semiconductor package of example 16, wherein the substrate comprises a base pad of electrically insulating material and the die pad is provided by a single layer of metal which is the only metal region on an upper surface of the base pad.

Example 18. The semiconductor package of example 16, wherein the electrical connection between the gate lead and the gate terminals of the first and second transistor dies has a balanced configuration that provides substantially identical electrical impedance as between the gate terminals of the first and second discrete transistor dies and the gate lead.

Example 19. The semiconductor package of example 16, wherein the second DC voltage lead is part of a continuous second DC voltage structure that extends over the substrate and comprises an internal second DC connection span, wherein the internal second DC connection span comprises a planar section that is spaced apart from each of the transistor dies and depressions that protrude away from the planar section, and wherein the depressions are in direct ohmic contact with the second load terminals from the first and second discrete transistor dies.

Example 20. The semiconductor package of example 19, further comprising a press-fit connector attached to one or both of the continuous second DC voltage structure and the continuous gate metal structure.

Example 21. The semiconductor package of example 16, wherein the second DC voltage lead is part of a continuous second DC voltage structure that extends over the substrate and comprises first and second elongated rails, and wherein the first and second elongated rails directly overlap with the die pad.

Example 22. The semiconductor package of example 21, wherein the electrical connection between the second DC voltage lead and the second load terminals of the first and second transistor dies has a balanced configuration that provides substantially identical electrical impedance as between the second load terminals of the first and second transistor dies and the second DC voltage lead.

Example 23. The semiconductor package of example 21, further comprising interconnect elements that are in direct ohmic contact with the second load terminals of the first and second transistor dies and both of the first and second elongated rails.

Example 24. The semiconductor package of example 21, wherein the internal gate runner is an elongated metal structure that runs alongside the second elongated rail.

Example 25. A semiconductor package, comprising: a substrate comprising a die pad of metal; first and second discrete transistor dies mounted on the die pad, each of the first and second discrete transistor dies comprising first load terminals that face and electrically connect with the die pad and second load terminals and gate terminals that face away from the die pad; a gate lead that is electrically connected to the gate terminals of the first and second transistor dies; a first DC voltage lead that is electrically connected to the first load terminals from the first and second discrete transistor dies via the die pad; and a second DC voltage lead that is electrically connected to the second load terminals from the first and second discrete transistor dies, wherein the second DC voltage lead is part of a continuous second DC voltage structure that extends over the substrate and comprises first and second elongated rails, and wherein the first and second elongated rails directly overlap with the die pad.

Example 26. The semiconductor package of example 25, wherein the electrical connection between the second DC voltage lead and the second load terminals of the first and second transistor dies has a balanced configuration that provides substantially identical electrical impedance as between the second load terminals of the first and second transistor dies and the second DC voltage lead.

Example 27. The semiconductor package of example 25, wherein the substrate comprises a base of electrically insulating material and the die pad is provided by a single layer of metal which is the only metal region on an upper surface of the base pad.

The term "interconnect element" as used herein encompasses any electrically conductive element that can be connected between two conductive regions to complete an electrical interconnection between them. Examples of interconnect elements include bond wires, ribbons and metal clips. The figures show some connections provided by a plurality of the interconnect elements connected in parallel and some connections provided by single interconnect elements. In any of the embodiments, each of these connections may be provided by a single interconnect element or by more than one interconnect element.

The term "direct ohmic connection," "direct ohmic contact" and the like refers to a low resistance connection between two elements that is ohmic, i.e., non-rectifying. This connection may be effectuated by physical contact between the concerned elements or by a conductive intermediary, such as solder, sinter, glue, etc., arranged between the concerned elements.

The term "substantially" as used herein encompasses absolute conformity with a requirement and near conformity with a requirement that is with acceptable design limits. In the case of a "substantially identical electrical impedance," the electrical resistance, capacitance, inductance, or any combination thereof may be within 2% from identical. In the case of a "substantially equidistant" arrangement, the separation distance between the two elements and the reference point may be within 5% of one another, and/or may be within acceptable process tolerances for the placement process.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor package, comprising:
a substrate comprising a die pad;
first and second discrete transistor dies mounted on the die pad;
an encapsulant body that encapsulates the first and second discrete transistor dies; and
a plurality of leads that are exposed from the encapsulant body,
wherein the first and second discrete transistor dies are connected in parallel with one another by electrical interconnections that electrically connect common terminals of the first and second discrete transistor dies to one of the leads, and
wherein at least one of the electrical interconnections has a balanced configuration that provides substantially identical electrical impedance as between the common terminals of the first and second discrete transistor dies and the lead to which they are connected,
wherein each of the first and second discrete transistor dies comprise:
first load terminals that face and electrically connect with the die pad; and
second load terminals and gate terminals that face away from the die pad,
wherein the plurality of leads comprises a first DC voltage lead, a second DC voltage lead, and a gate lead, and
wherein the electrical interconnections comprise:
a gate connection that connects the gate terminals of the first and second discrete transistor dies with the gate lead;
a first DC voltage connection that connects the first load terminals of the first and second discrete transistor dies with the first DC voltage lead; and
a second DC voltage connection that connects the second load terminals of the first and second discrete transistor dies with the second DC voltage lead, and
wherein one or more of the gate connection, the first DC voltage connection, and the second DC voltage connection has the balanced configuration,
wherein the second DC voltage connection comprises first and second elongated rails that form a u-shaped geometry, and
wherein the second DC voltage connection has the balanced configuration,
wherein the semiconductor package further comprises:
a first electrical interconnection between the first rail and the second load terminal of the first discrete transistor die; and
a second electrical interconnection between the second rail and the second load terminal of the second discrete transistor die,
wherein the first and second electrical interconnections have substantially identical electrical impedance.

2. The semiconductor package of claim 1, wherein the substrate comprises a base pad of electrically isolating material and a structured metallization layer disposed on the base pad, and wherein the die pad is formed in the structured metallization layer.

3. The semiconductor package of claim 2, wherein the structured metallization layer comprises a gate distribution pad that is arranged within the die pad, and wherein the gate connection has the balanced configuration.

4. The semiconductor package of claim 3, wherein the gate connection comprises:
a common interconnect element connected between the gate lead and the gate distribution pad; and
first and second interconnect elements connected between the gate distribution pad and the gate terminals of the first and second discrete transistor dies, respectively, and
wherein the first and second interconnect elements have substantially identical electrical impedance.

5. The semiconductor package of claim 4, further comprising third and fourth discrete transistor dies mounted on the die pad, wherein the third and fourth discrete transistor dies each comprise first load terminals that face and electrically connect with the die pad and second load terminals and gate terminals that face away from the die pad, wherein the gate connection connects the gate terminals of the third and fourth discrete transistor dies with the gate lead, and wherein the gate connection provides substantially identical electrical impedance as between the gate terminals of the first, second, third and fourth discrete transistor dies and the gate lead.

6. The semiconductor package of claim 1, wherein the first DC voltage connection has the balanced configuration.

7. The semiconductor package of claim 1, wherein the substrate comprises a base pad of electrically isolating material and the die pad is provided by a single layer of metal which is the only metal region on an upper surface of the base pad.

8. The semiconductor package of claim 7, wherein the semiconductor package comprises a lead frame, wherein the lead frame is configured such that the gate lead is part of a continuous metal structure that comprises an internal runner that extends across an edge side of the substrate, and wherein the gate connection comprises interconnect elements connected between the gate terminals of the first and second discrete transistor dies and the internal runner.

9. A semiconductor package, comprising:
a substrate comprising a die pad of metal;
first and second discrete transistor dies mounted on the die pad, each of the first and second discrete transistor dies comprising first load terminals that face and electrically connect with the die pad and second load terminals and gate terminals that face away from the die pad;
a gate lead that is electrically connected to the gate terminals of the first and second transistor dies;
a first DC voltage lead that is electrically connected to the first load terminals from the first and second discrete transistor dies via the die pad; and
a second DC voltage lead that is electrically connected to the second load terminals from the first and second discrete transistor dies,
wherein the second DC voltage lead is part of a continuous second DC voltage structure that extends over the substrate and comprises an internal second DC connection span,
wherein the internal second DC connection span comprises a planar section that is spaced apart from each of the transistor dies and depressions that protrude away from the planar section, and
wherein the depressions are in direct ohmic contact with the second load terminals from the first and second discrete transistor dies.

10. The semiconductor package of claim 9, wherein the substrate comprises a base pad of electrically insulating material and the die pad is provided by a single layer of metal which is the only metal region on an upper surface of the base pad.

11. The semiconductor package of claim 9, wherein the electrical connection between the gate lead and the gate terminals of the first and second transistor dies has a balanced configuration that provides substantially identical electrical impedance as between the gate terminals of the first and second discrete transistor dies and the gate lead.

12. The semiconductor package of claim 9, further comprising a press-fit connector attached to one or both of the continuous second DC voltage structure and the continuous gate metal structure.

13. The semiconductor package of claim 9, wherein the second DC voltage lead is part of a continuous second DC voltage structure that extends over the substrate and comprises first and second elongated rails, and wherein the first and second elongated rails directly overlap with the die pad.

14. The semiconductor package of claim 13, wherein the electrical connection between the second DC voltage lead and the second load terminals of the first and second transistor dies has a balanced configuration that provides substantially identical electrical impedance as between the second load terminals of the first and second transistor dies and the second DC voltage lead.

15. The semiconductor package of claim 13, further comprising interconnect elements that are in direct ohmic contact with the second load terminals of the first and second transistor dies and both of the first and second elongated rails.

16. The semiconductor package of claim 13, wherein the internal gate runner is an elongated metal structure that runs alongside the second elongated rail.

* * * * *